United States Patent
Liao

(10) Patent No.: US 10,476,022 B2
(45) Date of Patent: Nov. 12, 2019

(54) ORGANIC LIGHT EMITTING DIODE AND MANUFACTURING METHOD THEREOF, DISPLAY APPARATUS

(71) Applicant: BOE TECHNOLOGY GROUP CO., LTD., Beijing (CN)

(72) Inventor: Chin Lung Liao, Beijing (CN)

(73) Assignee: BOE TECHNOLOGY GROUP CO., LTD., Beijing (CN)

(*) Notice: Subject to any disclaimer, the term of this patent is extended or adjusted under 35 U.S.C. 154(b) by 93 days.

(21) Appl. No.: 15/145,877

(22) Filed: May 4, 2016

(65) Prior Publication Data
US 2017/0018728 A1   Jan. 19, 2017

(30) Foreign Application Priority Data
Jul. 14, 2015  (CN) .......................... 2015 1 0413244

(51) Int. Cl.
*H01L 51/50* (2006.01)
*H01L 51/00* (2006.01)

(52) U.S. Cl.
CPC ........ *H01L 51/5044* (2013.01); *H01L 51/001* (2013.01); *H01L 51/0003* (2013.01); *H01L 51/0035* (2013.01); *H01L 51/0037* (2013.01); *H01L 51/0039* (2013.01); *H01L 51/0051* (2013.01); *H01L 51/0059* (2013.01); *H01L 51/0072* (2013.01); *H01L 51/0085* (2013.01); *H01L 51/5004* (2013.01); *H01L 2251/552* (2013.01)

(58) Field of Classification Search
CPC ............. H01L 51/5004; H01L 51/0003; H01L 51/001; H01L 51/0051; H01L 51/0072; H01L 51/0037; H01L 51/0035; H01L 51/0085; H01L 51/0059; H01L 51/0039; H01L 51/5044
See application file for complete search history.

(56) References Cited

U.S. PATENT DOCUMENTS

| | | | |
|---|---|---|---|
| 2005/0077817 A1* | 4/2005 | Yamazaki ........... | H01L 51/5016 313/504 |
| 2012/0091448 A1* | 4/2012 | Ueno .................... | H01L 51/506 257/40 |
| 2015/0108444 A1* | 4/2015 | Jiao ..................... | H01L 51/5206 257/40 |

FOREIGN PATENT DOCUMENTS

| | | | | |
|---|---|---|---|---|
| CN | 1729724 A | 2/2006 | | |
| CN | 101800291 B | 8/2010 | | |
| CN | 103346270 A | * 10/2013 | ......... | H04L 51/5206 |
| CN | 104701458 A | 6/2015 | | |

OTHER PUBLICATIONS

Chinese Office Action dated Apr. 26, 2016.
Chinese Office Action dated Oct. 17, 2016.

* cited by examiner

*Primary Examiner* — Golam Mowla
(74) *Attorney, Agent, or Firm* — Dilworth & Barrese, LLP.; Michael J. Musella, Esq.

(57) ABSTRACT

An organic light emitting diode, which includes a substrate, a first electrode, at least one of red and green emissive layers, a blue emissive layer, a second electrode, and an exciplex elimination layer that is formed between at least one of the red and green emissive layers and the blue emissive layer; the exciplex elimination layer acts to confine carriers in at least one of the red and green emissive layers.

14 Claims, 3 Drawing Sheets

ORGANIC LIGHT EMITTING DIODE AND MANUFACTURING METHOD THEREOF, DISPLAY APPARATUS

TECHNICAL FIELD

Embodiments of the present invention relate to an organic light emitting diode and a manufacturing method thereof, a display apparatus.

BACKGROUND ART

An Organic Light Emitting Diode (OLED) is such a display device in which a fluorophor or phosphor organic compound is electrically excited to emit light. Enhancing luminous efficiency of the OLED device as much as possible is one of technical objectives in the field of OLED.

SUMMARY OF THE INVENTION

The embodiment of the present disclosure provides an organic light emitting diode, comprising a substrate, a first electrode, at least one of red and green emissive layers, a blue emissive layer, a second electrode, and an exciplex elimination layer that is formed between at least one of the red and green emissive layers and the blue emissive layer; wherein, the exciplex elimination layer is configured to confine carriers in at least one of the red and green emissive layers.

The embodiment of the present disclosure also provides a manufacturing method of an organic light emitting diode, comprising: forming a first electrode and at least one of red and green emissive layers on a substrate; forming an exciplex elimination layer on at least one of the red and green emissive layers; forming a blue emissive layer and a second electrode on the exciplex elimination layer; wherein, the exciplex elimination layer is configured to confine carriers in at least one of the red and green emissive layers.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

DETAILED DESCRIPTION

In order to make objects, technical details and advantages of the embodiments of the invention apparent, the technical solutions of the embodiments will be described in a clearly and fully understandable way in connection with the drawings related to the embodiments of the invention. Apparently, the described embodiments are just a part but not all of the embodiments of the invention. Based on the described embodiments herein, those skilled in the art can obtain other embodiment(s), without any inventive work, which should be within the scope of the invention.

An OLED device usually includes a blue emissive layer, a red emissive layer or a green emissive layer. The blue emissive layer and the red and/or green emissive layer(s) are disposed adjacently. A new luminous species may be produced between the blue emissive layer and the red and/or green emissive layer(s), and luminous efficiency will be reduced by this new luminous species. In order to solve the problem, the following schemes are provided by embodiments of the invention.

Figure 2:
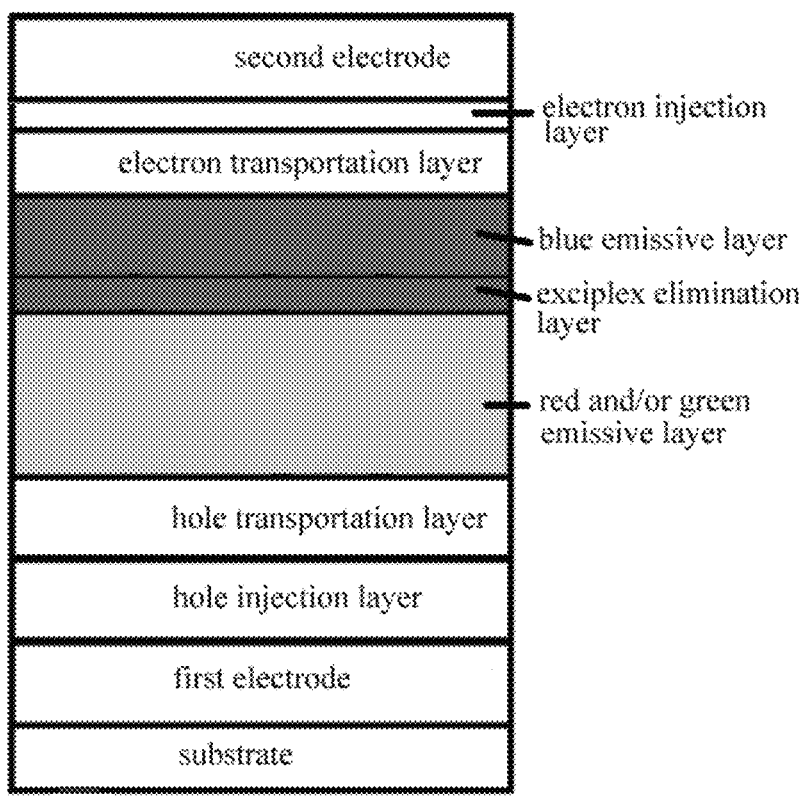
FIG. 2 is a structurally schematic view illustrating an organic light emitting diode provided by an embodiment of the present invention.

FIG. 2 is a structurally schematic view illustrating an organic light emitting diode provided by an embodiment of the invention. The organic light emitting diode includes a substrate, a first electrode, red and/or green emissive layer(s), a blue emissive layer, a second electrode, and an exciplex elimination layer that is formed between the red and/or green emissive layer(s) and the blue emissive layer.

Carriers are confined in the red/green emissive layer(s) by the exciplex elimination layer. By addition of the exciplex elimination layer, exciplex can be prevented from being produced between the red and/or green emissive layer(s) and the blue emissive layer.

The red emissive layer is a luminous layer emitting red light, the green emissive layer is a luminous layer emitting green light, and the blue emissive layer is a luminous layer emitting blue light.

In the present embodiment, by means of providing an exciplex elimination layer between red and/or green emissive layer(s) and a blue emissive layer, carriers are confined in the red and/or green emissive layer(s), and thus, it is assured that carriers recombine in the red and/or green emissive layer(s) and a red light and/or a green light are/is emitted. Eventually, luminous efficiency is promoted.

As illustrated in FIG. 2, the organic light emitting diode provided by the embodiment further includes one or more of a hole injection layer, a hole transportation layer, an electron transportation layer and an electron injection layer.

In the present embodiment, for example, material of the exciplex elimination layer may be the same as material of the electron transportation layer. Thus, the exciplex elimination layer has the electron transportation capability, and is capable of effectively suppressing transportation of carriers so as to confine carriers in the red and/or green emissive layer(s). For example, materials of the electron transportation layer and the exciplex elimination layer are both Bphen (4,7-diphenyl-1,10-phenanthroline).

For example, the difference between an energy level of the Highest Occupied Molecular Orbital (abbreviation: HOMO) of the exciplex elimination layer and an energy level of the Highest Occupied Molecular Orbital (HOMO) of a host material of the blue emissive layer is less than 1 ev. For another example, the difference between the energy level of the Highest Occupied Molecular Orbital of the exciplex elimination layer and the energy level of the Highest Occupied Molecular Orbital of a host material of the blue emissive layer is less than 0.6 ev.

In the present embodiment, method for fabricating red and/or green emissive layer(s), for example, may be any one selected from the group consisting of a spin coating method, a blade coating method, an electrical spray coating method, a slot coating method, a strip coating method, a dip coating method, a roller coating method, an ink-jet printing method, a nozzle printing method and an anastatic printing method.

In the present embodiment, method for fabricating the exciplex elimination layer and the blue emissive layer, for example, may be any one of vacuum thermal evaporation, organic vapor deposition, laser induced thermal imaging and radiation induced sublimation transfer. The same method may be used for fabricating the exciplex elimination layer and the blue emissive layer, and by doing this, it is possible to decrease the fabricating steps of the organic light emitting diode, and to reduce the fabricating cost.

Another embodiment of the invention provides a manufacturing method of the above organic light emitting diode. The method includes, forming a first electrode and red and/or green emissive layer(s) on a substrate; forming an exciplex elimination layer on the red and/or green emissive layer(s); and forming a blue emissive layer and a second electrode on the exciplex elimination layer.

The carriers are confined in the green emissive layer by the exciplex elimination layer.

In the present embodiment, formation of the red and/or green emissive layer(s) includes: by a spin coating method, red and/or green emissive layer(s) are/is formed on the first electrode.

In the present embodiment, formation of the blue emissive layer and the second electrode includes: by a vacuum thermal evaporation method, a blue emissive layer and a second electrode are formed on the exciplex elimination layer sequentially.

For example, the manufacturing method of the organic light emitting diode may further include that, a hole injection layer and/or a hole transportation layer and/is formed between the first electrode and the red and/or green emissive layer(s); and/or, an electron transportation layer and/or an electron injection layer are/is formed between the blue emissive layer and the second electrode.

In the present embodiment, material of the exciplex elimination layer may be the same as material of the electron transportation layer. The exciplex elimination layer exhibits good electron transportation capability, and thus, it can effectively suppress transportation of carriers so as to confine carriers in the red and/or green emissive layer(s). For example, materials of the electron transportation layer and the exciplex elimination layer are both Bphen (4,7-diphenyl-1,10-phenanthroline).

For example, the difference between the energy level of the Highest Occupied Molecular Orbital (abbreviation: HOMO) of material of the exciplex elimination layer and the energy level of the Highest Occupied Molecular Orbital HOMO of a host material of the blue emissive layer is less than 1 ev. For another example, the difference between the energy level of the Highest Occupied Molecular Orbital of material of the exciplex elimination layer and the energy level of the Highest Occupied Molecular Orbital of a host material of the blue emissive layer is less than 0.6 ev.

In the present embodiment, fabricating method of the red and/or green emissive layer(s), for example, may be any one selected from the group consisting of a spin coating method, a blade coating method, an electrical spray coating method, a slot coating method, a strip coating method, a dip coating method, a roller coating method, an ink-jet printing method, a nozzle printing method and an anastatic printing method.

In the present embodiment, fabricating method of the the exciplex elimination layer and the blue emissive layer, for example, may be any one of vacuum thermal evaporation, organic vapor deposition, laser induced thermal imaging and radiation induced sublimation transfer. The same method may be used for fabricating the exciplex elimination layer and the blue emissive layer, and by doing this, it is possible to reduce the fabricating steps of the organic light emitting diode, and to reduce the fabricating cost.

According to another embodiment of the invention, there is provided a display apparatus, which includes the organic light emitting diode in the above-mentioned embodiments. The display apparatus, for example, may be a display panel, a display apparatus, a tablet computer, a mobile phone, a navigator, a camera, a video camera, a television or any other equipment having a display function.

Embodiment 1

Figure 3:
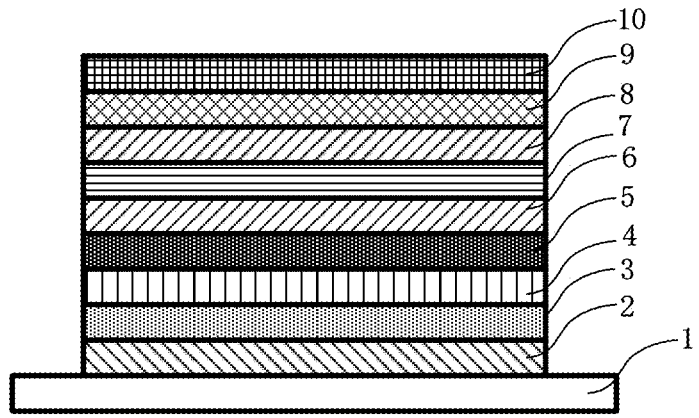
FIG. 3 is a schematic view illustrating a sectional structure of an organic light emitting diode provided by another embodiment of the invention.
Figure 4:
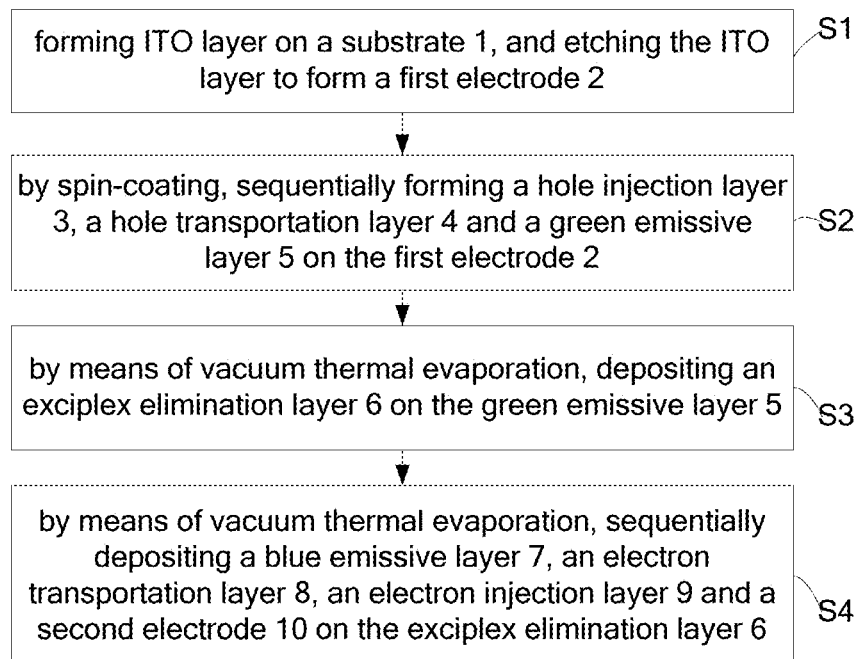
FIG. 4 is a flowchart illustrating a manufacturing method of an organic light emitting diode display provided by another embodiment of the invention.

For the sake of illustrating technical solutions of the invention more clearly, an organic light emitting diode illustrated in FIG. 3 will be described below in combination with specific embodiments. As illustrated in FIG. 4, a manufacturing method of the organic light emitting diode of the embodiment may include the following steps:

S1, an Indium Tin Oxide (ITO) layer is formed on a substrate 1, and is etched to form a first electrode 2;

For example, the substrate 1 is a transparent glass, and thickness of the first electrode 2 is about 70 nm. For example, after formation of the first electrode 2, the ITO glass base may be cleaned with a deionized water, acetone and anhydrous ethanol in ultrasonic environments, and after cleaning, it is blown dry with nitrogen and is treated with oxygen plasma.

S2, a hole injection layer 3, a hole transportation layer 4 and a green emissive layer 5 are formed on the first electrode 2 sequentially by a spin coating method;

For example, firstly, a polymer of 3,4-ethylene dioxide thiophene: Poly(3,4-ethylene dioxythiophene): poly(styrenesulfonate) (abbreviation: PEDOT:PSS) is spin-coated on the first electrode 2, so as to form a hole injection layer 3, thickness of which is about 20 nm; next, Polyvinylcarbazole (abbreviation: PVK) is spin-coated on the hole injection layer 3, so as to form a hole transportation layer 4, thickness of which is about 20 nm; further, a green emissive layer 5 is formed on the hole transportation layer 4 by spin-coating. A host material of the green emissive layer 5 is Poly(9,9-n-dihexyl-2,7-fluorene-alt-9-phenyl-3,6-carbazole) doped with 1,3-Bis(5-(4-(tert-butyl)phenyl)-1,3,4-oxadiazol-2-yl) benzene (60:40), a guest material of the green emissive layer 5 is Tris(2-phenylpyridine)iridium(III) (abbreviation: Ir(ppy)$_3$), and thickness of the green emissive layer 5 is about 60 nm.

S3, through a vacuum thermal evaporation process, an exciplex elimination layer 6 is deposited on the green emissive layer 5.

For example, the treated substrate is placed within an evaporation chamber, and after a pressure within the evaporation chamber decreases to less than $5 \times 10^{-4}$ Pa, through a vacuum thermal evaporation method, Bphen (4,7-diphenyl-1,10-phenanthroline) is deposited to form an exciplex elimination layer 6 with a thickness of about 5 nm. Materials for the exciplex elimination layer 6 and the electron transportation layer 8 are the same, and both of them are Bphen in the present embodiment.

S4, by means of vacuum thermal evaporation, a blue emissive layer 7, an electron transportation layer 8, an electron injection layer 9 and a second electrode 10 are sequentially deposited on the exciplex elimination layer 6.

For example, by means of vacuum thermal evaporation, a blue emissive layer 7 is deposited on the exciplex elimination layer 6. A host material of the blue emissive layer 7 is MAND, and its guest material is 1-4-di[4-(N,N-diphenyl)amino]styryl-benzene (abbreviation: DSA-Ph). Doping concentration of the guest material is about 5%. Thickness of the blue emissive layer 7 is about 20 nm. Next, Bphen is deposited on the blue emissive layer 7, so as to form an electron transportation layer 8. Thickness of the electron transportation layer 8 is about 20 nm. LiF (lithium fluoride) is deposited on the electron transportation layer 8, so as to form an electron injection layer 9. Thickness of the electron injection layer is about 1 nm. Al (aluminum) is deposited on the electron injection layer 8, so as to form a second electrode 10. Thickness of the second electrode 10 is about 120 nm.

During the above vacuum thermal evaporation, except that Al is etched with a metal mask and its evaporation rate is 0.3 nm/s, every other layer is etched with an open mask and its evaporation rate is 0.1 nm/s. The luminous area of the device is 2 mm×2 mm.

For comparison, a manufacturing method of an organic light emitting diode provided by a comparative embodiment will be described below.

Figure 1:
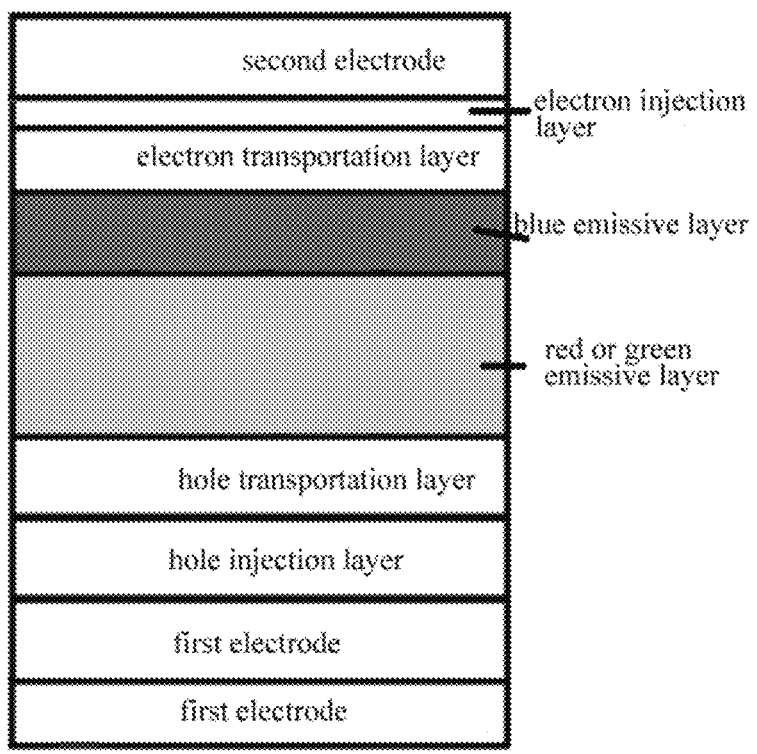
FIG. 1 is a structurally schematic view illustrating a conventional organic light emitting diode.

As illustrated in FIG. 1, the device prepared by the comparative embodiment includes a glass base including a transparent ITO anode, a hole injection layer, a hole transportation layer, a green emissive layer, a blue emissive layer, an electron transportation layer, an electron injection layer and a second electrode/a cathode that are sequentially laminated. The fabricating method is as follows.

In the present embodiment, the ITO glass base is a transparent glass with a thin film of indium tin oxide. The first electrode is ITO, and its layer thickness is about 70 nm. The hole injection layer is Poly(3,4-ethylenedioxythiophene):poly(styrenesulfonate) (abbreviation: PEDOT:PSS), the hole transportation layer is Polyvinylcarbazole (abbreviation: PVK), a doping host of the green emissive layer is Poly(9,9-n-dihexyl-2,7-fluorene-alt-9-phenyl-3,6-carbazole)polyfluorene doped with 1,3-Bis(5-(4-(tert-butyl)phenyl)-1,3,4-oxadiazol-2-yl)benzene (60:40), a doping guest of the green emissive layer is Tris(2-phenylpyridine)iridium (III) (abbreviation: Ir(ppy)$_3$), a doping host of the blue emissive layer is 2-methyl-9,10-bis(naphthalen-2-yl)anthracene (abbreviation: MAND), a doping guest of the blue emissive layer is 1-4-di-[4-(N,N-diphenyl)amino]styryl-benzene (abbreviation: DSA-Ph), the electron transportation layer is of Bphen, the electron injection layer is of LiF, and the second electrode/the cathode is of Al.

The above transparent glass substrate with ITO (whose sheet resistance <30 Ω/□), is subjected to photolithography so as to form pattern of ITO electrodes, next, the ITO glass base is cleaned sequentially with a deionized water, acetone and anhydrous ethanol in ultrasonic environments, and then, it is blown dry by N$_2$ and is subjected to O$_2$ plasma treatment. After that, a hole injection layer of PEDOT:PSS (20 nm), a hole transportation layer of PVK (20 nm), and a green emissive layer of Poly(9,9-n-dihexyl-2,7-fluorene-alt-9-phenyl-3,6-carbazole) doped with 1,3-Bis(5-(4-(tert-butyl)phenyl)-1,3,4-oxadiazol-2-yl)benzene (60:40):Ir(ppy)3 (60 nm) are sequentially spin-coated on the ITO. Finally, the treated substrate is placed in an evaporation chamber, and after a pressure within the evaporation chamber decreases to lower than 5×10$^{-4}$ Pa, by a vacuum thermal evaporation method, a blue emissive layer of MAND:DSA-Ph (5%) (20 nm), an electron transportation layer of Bphen (20 nm), an electron injection layer LiF (1 nm) and a second electrode/a cathode of Al (120 nm) are sequentially deposited. During the above vacuum thermal evaporation, except that Al is etched with a metal mask and its evaporation rate is 0.3 nm/s, every other layer is etched with an open mask and its evaporation rate is 0.1 nm/s. The luminous area of the device is 2 mm×2 mm.

The above embodiment 1 and the comparative embodiment are tested, and a comparison result of technical effects between Embodiment 1 and the comparative embodiment as illustrated in Table 1 can be obtained.

TABLE 1 technical effects of Embodiment 1

| Device | Volt (V) | Efficiency (cd/A) | EQE (%) | CIEx | CIEy |
|---|---|---|---|---|---|
| Embodiment 1 | 4 | 56.7 | 14.5 | 0.306 | 0.649 |
| Comparative embodiment | 4.2 | 31.0 | 11.2 | 0.379 | 0.594 |

As can be seen from table 1, when brightness is 1000 nits, operating voltage, Current Efficiency, External Quantum Efficiency (EQE) and chromaticity coordinates (CIE1931) of an organic light emitting diode in Embodiment 1 are 4V, 56.7 cd/A, 14.5% and (0.306, 0.649), respectively; while operating voltage, Current Efficiency, External Quantum Efficiency (EQE) and chromaticity coordinates (CIE1931) of an organic light emitting diode in comparative embodiment are 4.2V, 31.0 cd/A, 11.2% and (0.379, 0.594), respectively. As can be seen from this, in the same brightness, the operating voltage of the organic light emitting diode in Embodiment 1 is lower than the operating voltage of the organic light emitting diode in the comparative embodiment, while each of the current efficiency and the external quantum efficiency of the organic light emitting diode in Embodiment 1 is higher than that in the comparative embodiment. Therefore, as compared with the comparative embodiment, it is possible that the operating voltage is effectively lowered and the efficiency is enhanced by the technical solution provided by Embodiment 1 of the present invention.

Figure 5:
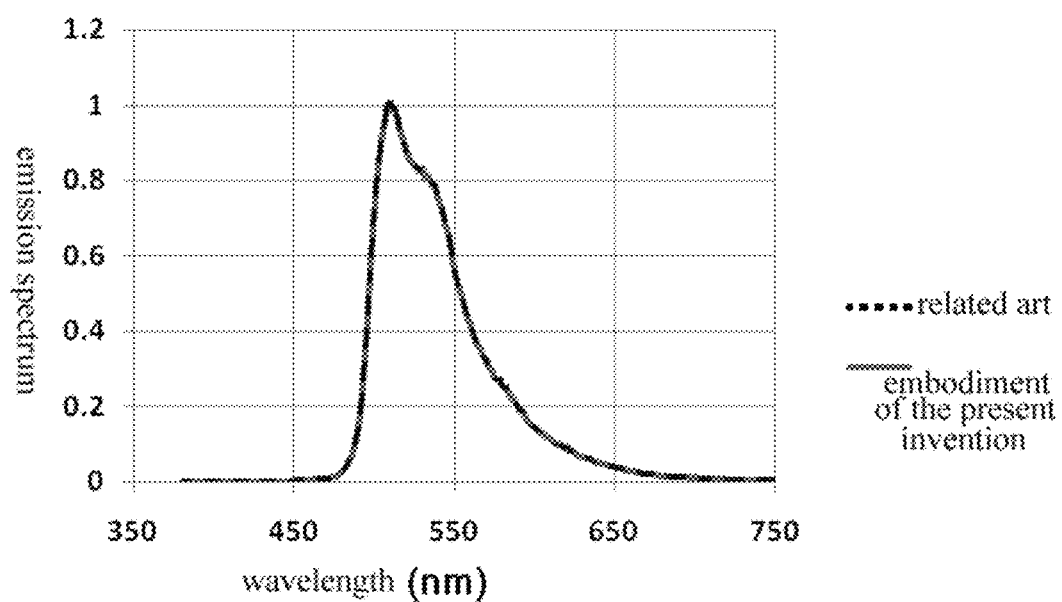
FIG. 5 is a comparative diagram illustrating spectrum in an embodiment of the invention and spectrum in a conventional technology.

FIG. 5 illustrates a comparison of spectrogram between the technical solution provided by Embodiment 1 and a conventional technology. As can be seen from FIG. 5, a spectrogram of Embodiment 1 of the invention substantially coincide with a spectrogram of the general technology, and so, the chrominance is not changed by the technical solution provided by Embodiment 1 of the invention.

According to embodiments of the present invention, there are provided an organic light emitting diode and a manufacturing method thereof, in which, by means of providing an exciplex elimination layer between a green emissive layer and a blue emissive layer, carriers can be confined in the green emissive layer, thereby ensuring that carriers recombine in the green emissive layer and a green light is emitted, lowering operating voltage of OLEDs and promoting the efficiency. Of course, an exciplex elimination layer may also be provided between a red emissive layer and a blue emissive layer, or an exciplex elimination layer is provided between a red emissive layer and a blue emissive layer and between a green emissive layer and a blue emissive layer, so as to promote the luminous efficiency, and repetitions are omitted.

The above are merely exemplary embodiments of the present invention, and are not intended to limit the scope of protection of the present invention, which is yet determined by the appended claims.

The present application claims the priority of the Chinese patent application No. 201510413244.7 on Jul. 14, 2015, the entirety of which is incorporated herein by reference as a part of the present application.

The invention claimed is:

1. An organic light emitting diode, comprising a substrate, a first electrode, at least one of a red emissive layer and a green emissive layer, a blue emissive layer, a second electrode, and an exciplex elimination layer formed between the at least one of the red emissive layer and the green emissive layer and the blue emissive layer;
   wherein the exciplex elimination layer is configured to confine carriers in the at least one of the red emissive layer and the green emissive layer,
   a host material of the blue emissive layer comprises 2-methyl-9,10-bis(naphthalen-2-yl)anthracene, and a guest material of the blue emissive layer comprises 1-4-di-[4-(N,N-diphenyl)amino]styryl-benzene, a doping concentration of the guest material is about 5%, and
   the first electrode is an anode, the second electrode is a cathode, the at least one of a red emissive layer and a green emissive layer is closer to the anode than the blue emissive layer, and the blue emission layer is closer to the cathode than the at least one of a red emissive layer and a green emissive layer.

2. The organic light emitting diode claimed as claim 1, wherein the organic light emitting diode further comprises one or more selected from the group consisting of a hole injection layer, a hole transportation layer, an electron injection layer and an electron transportation layer.

3. The organic light emitting diode claimed as claim 2, wherein the exciplex elimination layer and the electron transportation layer are of a same material.

4. The organic light emitting diode claimed as claim 1, wherein the exciplex elimination layer has a material of 4,7-diphenyl-1,10-phenanthroline.

5. A manufacturing method of an organic light emitting diode, comprising:
   forming a first electrode, and at least one of a red emissive layer and a green emissive layer on a substrate;
   forming an exciplex elimination layer on the at least one of the red emissive layer and the green emissive layer; and
   forming a blue emissive layer and a second electrode on the exciplex elimination layer,
   wherein the exciplex elimination layer is configured to confine carriers in the at least one of the red emissive layer and the green emissive layer,
   a host material of the blue emissive layer comprises 2-methyl-9,10-bis(naphthalen-2-yl)anthracene, and a guest material of the blue emissive layer comprises 1-4-di-[4-(N,N-diphenyl)amino]styryl-benzene, a doping concentration of the guest material is about 5%, and
   the first electrode is an anode, the second electrode is a cathode, the at least one of a red emissive layer and a green emissive layer is closer to the anode than the blue emissive layer, and the blue emission layer is closer to the cathode than the at least one of a red emissive layer and a green emissive layer.

6. The method claimed as claim 5, wherein the forming the at least one of the red emissive layer and the green emissive layer comprises:
   forming the at least one of the red emissive layer and the green emissive layer on the first electrode by a spin-coating method.

7. The method claimed as claim 5, wherein the forming the blue emissive layer and the second electrode layer comprises:
   sequentially forming the blue emissive layer and the second electrode on the exciplex elimination layer by a vacuum thermal evaporation method.

8. The method claimed as claim 5, wherein the method further layer comprises at least one of the following two steps:
   forming at least one of a hole injection layer and a hole transportation layer between the first electrode and the at least one of the red emissive layer and the green emissive layer; and
   forming at least one of an electron transportation layer and an electron injection layer between the blue emissive layer and the second electrode.

9. The method claimed as claim 8, wherein the exciplex elimination layer and the electron transportation layer are of a same material.

10. The method claimed as claim 5, wherein the exciplex elimination layer comprises a material of 4, 7-diphenyl-1, 10-phenanthroline.

11. A display apparatus, comprising the organic light emitting diode claimed as claim 1.

12. The display apparatus claimed as claim 11, wherein the organic light emitting diode further comprises one or more selected from the group consisted of a hole injection layer, a hole transportation layer, an electron injection layer and an electron transportation layer.

13. The display apparatus claimed as claim 11, wherein a material for the exciplex elimination layer and a material for the electron transportation layer are the same.

14. The display apparatus claimed as claim 11, wherein the exciplex elimination layer comprises a material of 4,7-diphenyl-1, 10-phenanthroline.

* * * * *